(12) United States Patent
Niki

(10) Patent No.: US 11,557,538 B2
(45) Date of Patent: Jan. 17, 2023

(54) SEMICONDUCTOR STORAGE DEVICE

(71) Applicant: Kioxia Corporation, Tokyo (JP)

(72) Inventor: Yusuke Niki, Yokohama (JP)

(73) Assignee: Kioxia Corporation, Tokyo (JP)

(*) Notice: Subject to any disclaimer, the term of this patent is extended or adjusted under 35 U.S.C. 154(b) by 315 days.

(21) Appl. No.: 17/016,795

(22) Filed: Sep. 10, 2020

(65) Prior Publication Data

US 2021/0265259 A1    Aug. 26, 2021

(30) Foreign Application Priority Data

Feb. 25, 2020  (JP) .............................. JP2020-029715

(51) Int. Cl.
| H01L 23/528 | (2006.01) |
| H01L 27/24 | (2006.01) |
| H01L 23/522 | (2006.01) |
| G11C 11/408 | (2006.01) |
| G11C 16/08 | (2006.01) |

(52) U.S. Cl.
CPC ........ *H01L 23/528* (2013.01); *H01L 23/5226* (2013.01); *H01L 27/2409* (2013.01); *H01L 27/2436* (2013.01); *H01L 27/2463* (2013.01); *G11C 11/4085* (2013.01); *G11C 16/08* (2013.01)

(58) Field of Classification Search
CPC .............. H01L 23/528; H01L 23/5226; H01L 27/2409; H01L 27/2436; H01L 27/2463; G11C 2213/72; G11C 7/12; G11C 8/08; G11C 8/14; G11C 13/0026; G11C 13/0028; G11C 13/003; G11C 13/0004; G11C 16/08; G11C 16/0408; G11C 16/0483; G11C 11/4085
See application file for complete search history.

(56) References Cited

U.S. PATENT DOCUMENTS

| 8,854,913 B2 | 10/2014 | Jang |
| 9,466,372 B2 | 10/2016 | An |

(Continued)

FOREIGN PATENT DOCUMENTS

JP    2021-44041 A    3/2021

OTHER PUBLICATIONS

U.S. Appl. No. 16/782,114, filed Feb. 5, 2020, Yusuke Niki.

*Primary Examiner* — Patricia D Valenzuela
(74) *Attorney, Agent, or Firm* — Oblon, McClelland, Maier & Neustadt, L.L.P.

(57) ABSTRACT

A memory includes first signal lines divided into groups respectively including m (m is an integer equal to or larger than 2) lines, and second signal lines. A memory cell array includes memory cells. (m+2) or more global signal lines are configured to apply a selection voltage to any of the first signal lines. First transistors are provided to correspond to each of the first signal lines in one-to-one correspondence and are connected between the first signal lines and the global signal lines. First selection signal lines are provided to respectively correspond to the groups, and are each connected to gate electrodes of the first transistors included in a corresponding one of the groups in common. The first signal lines located at both ends of each of any two of the groups which are adjacent to each other are connected to mutually different ones of the global signal lines.

17 Claims, 10 Drawing Sheets

(56) References Cited

U.S. PATENT DOCUMENTS

2014/0104948 A1* 4/2014 Rhie .................. G11C 11/4085
365/185.11
2016/0141039 A1 5/2016 Arakawa
2021/0082507 A1 3/2021 Niki

* cited by examiner

SEMICONDUCTOR STORAGE DEVICE

CROSS REFERENCE TO RELATED APPLICATIONS

This application is based upon and claims the benefit of priority from the prior Japanese Patent Application No. 2020-029715, filed on Feb. 25, 2020, the entire contents of which are incorporated herein by reference.

FIELD

The embodiments of the present invention relate to a semiconductor storage device.

BACKGROUND

In recent years, the number of bit lines or word lines is significantly increasing along with increase of the capacity of a semiconductor storage device. The increase of the number of bit lines or word lines causes increase of the arrangement area of a decoder for selecting the bit lines or the word lines. Therefore, it is desired to reduce the arrangement area of a multiplexer for selecting the bit lines or the word lines in the decoder.

In order to reduce the arrangement area of the multiplexer, it is considered to omit a part of transistors included in the multiplexer, for example. However, when a transistor is simply omitted from the multiplexer, controllability and flexibility in application of a voltage to a bit line or a word line is reduced, for example. As a result, there is a possibility that a voltage of an unselected bit line or an unselected word line other than a selected bit line or a selected word line cannot be controlled appropriately.

DETAILED DESCRIPTION

Figure 1:
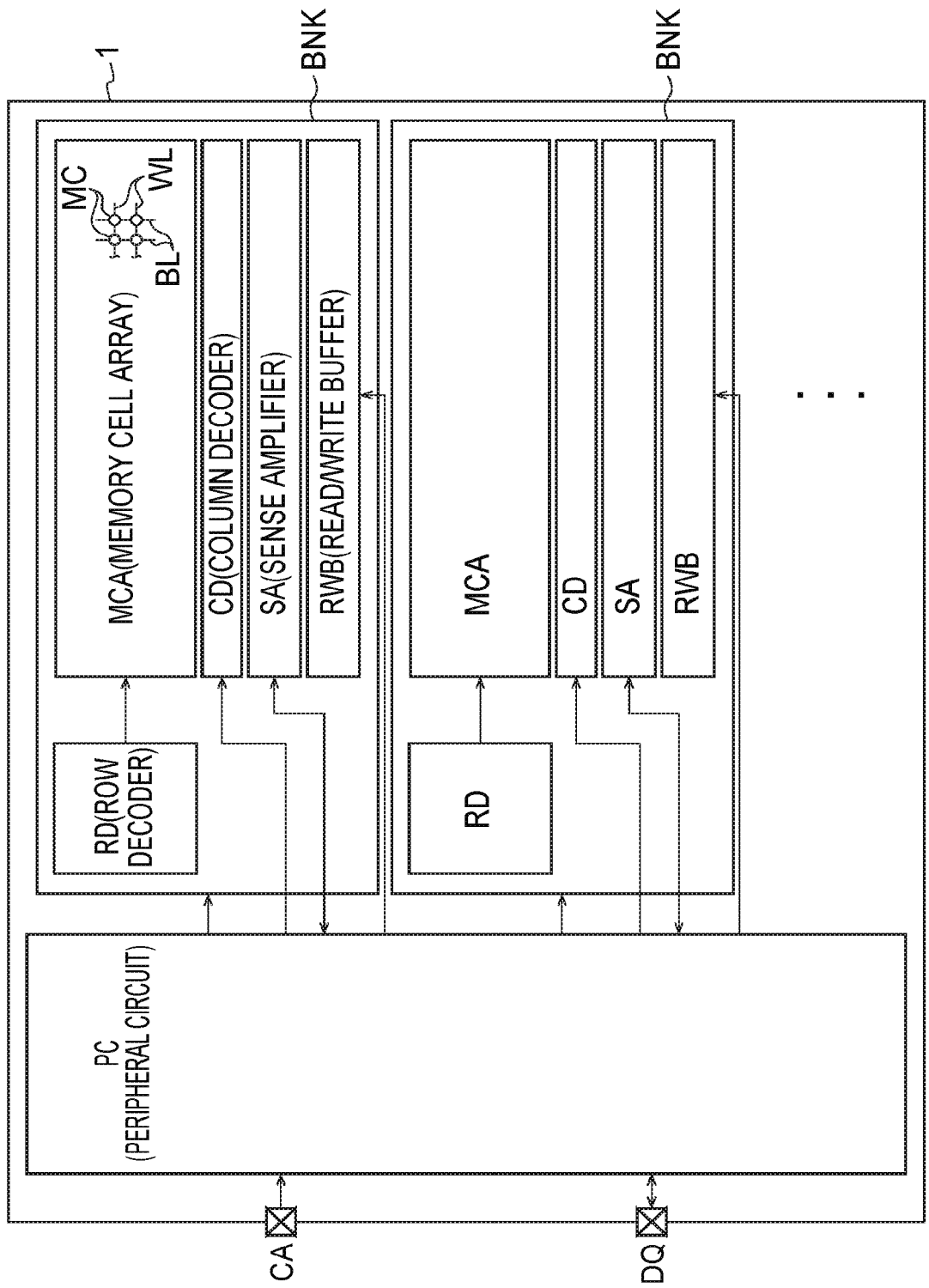
FIG. 1 is a block diagram illustrating a configuration example of a semiconductor storage device according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A semiconductor storage device according to the present embodiment comprises a plurality of first signal lines divided into a plurality of groups each including m (m is an integer equal to or larger than 2) lines, and a plurality of second signal lines. A memory cell array includes a plurality of memory cells provided to respectively correspond to intersections between the first signal lines and the second signal lines. (m+2) or more global signal lines are configured to apply a selection voltage to any of the first signal lines. A plurality of first transistors are provided to correspond to each of the first signal lines in one-to-one correspondence and are connected between the first signal lines and the global signal lines. A plurality of first selection signal lines are provided to respectively correspond to the groups, and are each connected to gate electrodes of the first transistors included in a corresponding one of the groups in common. The first signal lines located at both ends of each of any two of the groups which are adjacent to each other are connected to mutually different ones of the global signal lines.

First Embodiment

FIG. 1 is a block diagram illustrating a configuration example of a semiconductor storage device according to a first embodiment. A semiconductor storage device 1 may be, for example, a volatile memory such as a DRAM or a non-volatile memory such as a NAND EEPROM (Electrically Erasable and Programmable Read-Only-Memory), a ReRAM, an MRAM, and a PCM. Further, the semiconductor storage device 1 may be, for example, a single memory chip or a module including a plurality of memory chips, such as a DIMM (Dual Inline Memory Module).

The semiconductor storage device 1 illustrated in FIG. 1 is configured as a single memory chip, for example. Hereinafter, the semiconductor storage device 1 is referred to as "memory chip 1". The memory chip 1 includes a memory cell array MCA, a column decoder CD, a row decoder RD, a sense amplifier SA, a read/write buffer RWB, and a peripheral circuit PC.

The memory cell array MCA includes a plurality of memory cells MC two-dimensionally arranged in a matrix, for example. The memory cells MC are PCMs, for example. The memory cells MC are arranged to correspond to respective intersections of bit lines BL and word lines WL, for example. That is, the memory cell array MCA is a so-called cross-point memory cell array. The bit lines BL intersect with the word lines WL substantially at a right angle, when viewed from above a semiconductor substrate. The bit lines BL are each connected to one ends of the memory cells MC of the memory cell array MCA. The word lines WL may be each connected to the other ends of the memory cells MC of the memory cell array MCA or may function as gate electrodes. The memory cell array MCA is divided into a plurality of banks BNK in one chip. The sense amplifier SA, a data latch DL, and an address latch AL are provided for each bank BNK, for example.

The sense amplifier SA is connected to the memory cells MC via the column decoder CD and the bit lines BL, for example, and applies a write voltage (for example, VDD or VSS) or a read voltage to the memory cells MC via the bit lines BL. The sense amplifier SA applies the write voltage to a memory cell MC to write data into that memory cell MC, or applies the read voltage to a memory cell MC to read data from that memory cell MC.

The read/write buffer RWB temporarily retains data detected by the sense amplifier SA and an address for each page or temporarily retains data to be written into the memory cell array MCA and an address for each page.

The row decoder RD and the column decoder CD make access to the memory cell array MCA based on a bank address or a page address and apply a write voltage or a read voltage to a selected word line WL or a selected bit line BL. The row decoder RD applies a write voltage or a read voltage to the selected word line selected from the word lines WL. The column decoder CD connects the selected bit line selected from the bit lines BL to the sense amplifier SA. The sense amplifier SA applies the write voltage or the read voltage to the selected bit line. Accordingly, the memory chip 1 can write data into a desired memory cell MC in the memory cells MC or read data from a desired memory cell MC.

Although not illustrated, the peripheral circuit PC includes a voltage generator, a read/write engine, an address controller, a command controller, and an input/output circuit, for example.

The voltage generator generates a voltage for the word lines WL and a voltage for the bit lines BL required for a data read operation and a data write operation.

The read/write engine controls the column decoder CD and the row decoder RD to write data into a desired memory cell MC in the bank BNK or read data from the desired memory cell MC in the bank BNK in accordance with a command and an address. The read/write engine transfers the read data to a DQ buffer in the input/output circuit.

The address controller receives a row address and a column address, for example, and decodes these addresses. The command controller receives commands indicating various types of operations including a data read operation and a data write operation and transfers those commands to the read/write engine.

The input/output circuit (JO) takes in a command and an address from a CA terminal CA and transfers the command to the command controller and the address to the address controller. The command may be a write command that instructs a write operation or a read command that instructs a read operation. The address may be a bank address indicating any of the banks BNK in the memory cell array MCA and an address indicating a page or a memory cell MC in the bank BNK for which reading or writing is to be performed. In a case where a plurality of the banks BNK form one bank group, the address may be an address of a bank group.

The input/output circuit takes in write data from a DQ terminal and transfers the write data to the read/write buffer RWB, or receives read data retained in the data latch DL and outputs the read data via the DQ terminal.

A memory controller (not illustrated) that controls all the memory chips 1 may be provided outside the memory chip 1.

Figure 2:
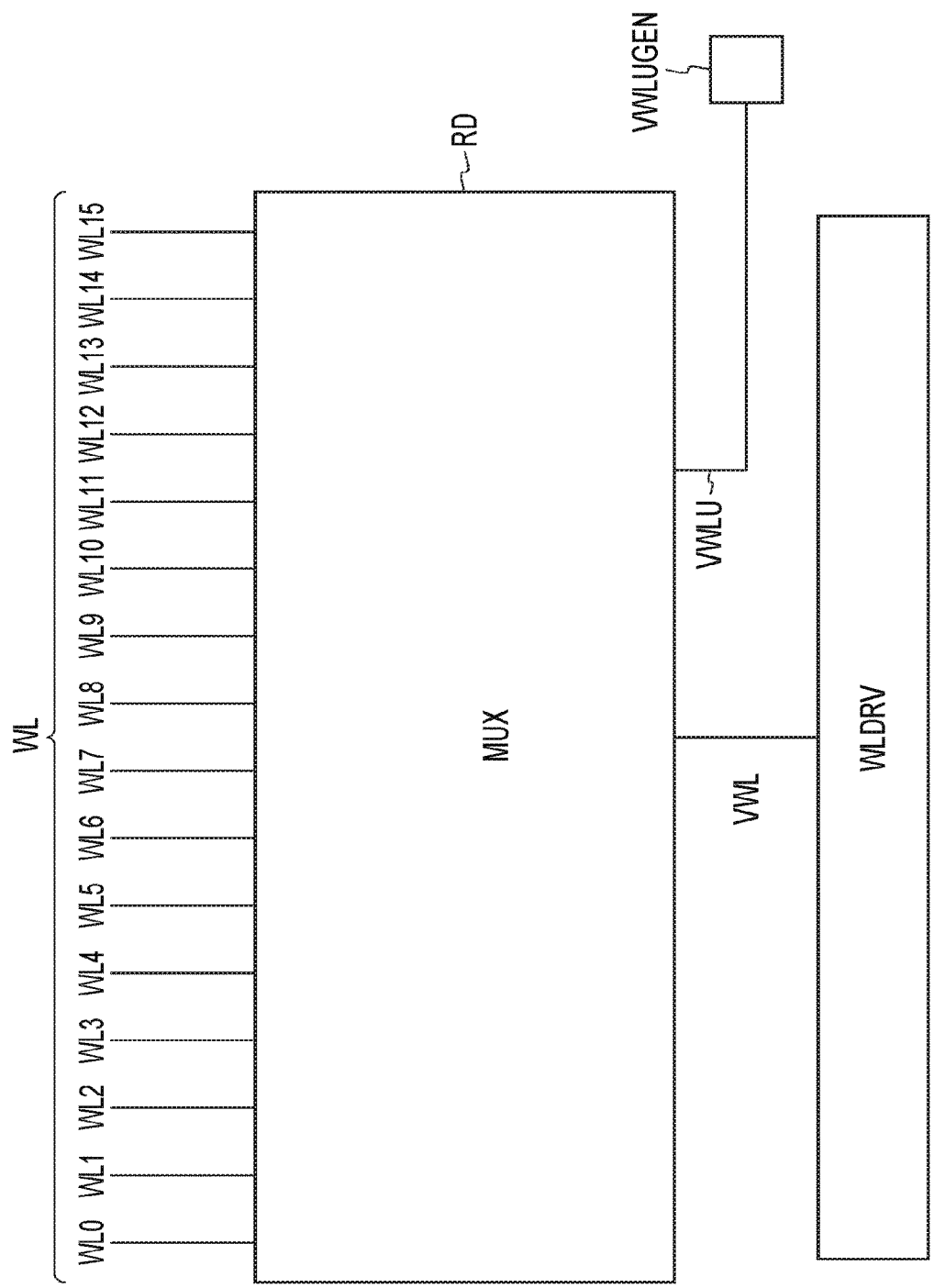
FIG. 2 is a block diagram illustrating a configuration example of the row decoder, a word-line drive, and the word lines.

FIG. 2 is a block diagram illustrating a configuration example of the row decoder RD, a word-line driver WLDRV, and the word lines WL. The row decoder RD includes a multiplexer MUX. The word-line driver WLDRV is configured as a portion of the voltage generator described above.

The multiplexer MUX is provided between the word lines WL and the word-line driver WLDRV. The multiplexer MUX is configured to be able to receive a selection voltage VWL and a non-selection voltage VWLU and apply either of them to each word line WL. An internal configuration of the multiplexer MUX will be described below.

The word-line driver WLDRV applies, for example, a write voltage (for example, VDD or VSS) or a read voltage to a selected memory cell MC as the selection voltage VWL.

A non-selection voltage generator VWLUGEN generates a non-selection voltage VWLU to be applied to an unselected memory cell MC that is not selected. The non-selection voltage generator VWLUGEN may be incorporated in the peripheral circuit PC or may be provided outside the memory chip 1. The non-selection voltage VWLU may be a ground voltage, for example. The selection voltage VWL may be a predetermined voltage generated from a power-supply voltage.

Figure 3:
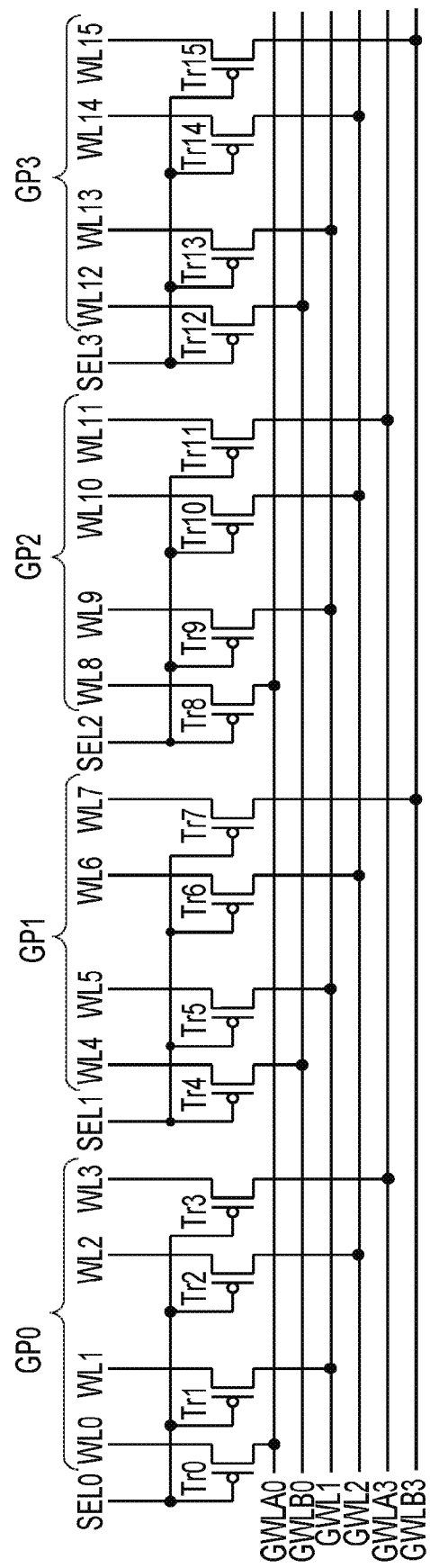
FIG. 3 is a circuit diagram illustrating a configuration example of the multiplexer in the row decoder according to the first embodiment.

FIG. 3 is a circuit diagram illustrating a configuration example of the multiplexer MUX in the row decoder RD according to the first embodiment. In the following descriptions, the multiplexer MUX is provided in the row decoder RD that selectively drives the word lines WL as first signal lines. In this case, second signal lines are the bit lines BL. However, the multiplexer MUX may be provided in the column decoder CD that selectively drives the bit lines BL. In this case, the second signal lines are the word lines WL. Further, the multiplexer MUX may be provided in both the column decoder CD and the row decoder RD.

The word lines WL are divided into a plurality of groups each including m (m is an integer equal to or larger than 2) word lines WL. In the present embodiment, 16 word lines WL are divided into four groups GP0 to GP3 each including four word lines WL, for example. That is, m=4 is established in the present embodiment. Dividing the word lines WL means conceptual division with regard to an operation in which a voltage is applied to the word lines WL. The total number of the word lines WL, the number of the groups, and the number of the word lines WL in each group are not specifically limited.

Global word lines GWLA0, GWLB0, GWL1, GWL2, GWLA3, and GWLB3 as global signal lines are provided for all the word lines WL (all the groups GP0 to GP3) in common. The number of the provided global word lines GWLA0, GWLB0, GWL1, GWL2, GWLA3, and GWLB3 is the number obtained by adding 2 to the number of the word lines WL in each group (that is, m+2). For example, in the present embodiment, four word lines WL are included in each of the groups GP0 to GP3, and six global word lines GWLA0, GWLB0, GWL1, GWL2, GWLA3, and GWLB3 are provided for the groups GP0 to GP3 in common.

The global word lines GWLA0 and GWLB0 respectively correspond to word lines located at one ends of two groups that are adjacent to each other. For example, the global word line GWLA0 corresponds to a word line WL0 at one end of the group GP0 and is connected to the word line WL0 via a transistor. The global word line GWLB0 corresponds to a word line WL4 at one end of the group GP1 adjacent to the group GP0 and is connected to the word line WL4 via a transistor. Similarly, the global word line GWLA0 corresponds to a word line WL8 at one end of the group GP2 and is connected to the word line WL8 via a transistor. The global word line GWLB0 corresponds to a word line WL12 at one end of the group GP3 adjacent to the group GP2 and is connected to the word line WL12 via a transistor.

The global word lines GWLA3 and GWLB3 respectively correspond to word lines located at the other ends of two groups that are adjacent to each other. For example, the global word line GWLA3 corresponds to a word line WL3 at the other end of the group GP0 and is connected to the word line WL3 via a transistor. The global word line GWLB3 corresponds to a word line WL7 at the other end of the group GP1 adjacent to the group GP0 and is connected to the word line WL7 via a transistor. Similarly, the global word line GWLA3 corresponds to a word line WL11 at the other end of the group GP2 and is connected to the word line WL11 via a transistor. The global word line GWLB3 corresponds to a word line WL15 at the other end of the group GP3 adjacent to the group GP2 and is connected to the word line WL15 via a transistor.

The word lines WL4 and WL7 at both ends of the group GP1 do not share global word lines with the word lines WL0 and WL3 and the word lines WL8 and WL11 at both ends of the groups GP0 and GP2 adjacent to the group GP1, and are connected to the global word lines GWLB0 and GWLB3 that are different from the global word lines GWLA0 and GWLA3 to which the word lines WL0 and WL3 and the word lines WL8 and WL11 are connected. Similarly, the word lines WL8 and WL11 at both ends of the group GP2 do not share global word lines with the word lines WL4 and WL7 and the word lines WL12 and WL15 at both ends of the groups GP1 and GP3 adjacent to the group GP2, and are connected to the global word lines GWLA0 and GWLA3 that are different from the global word lines GWLB0 and GWLB3 to which the word lines WL4 and WL7 and the word lines WL12 and WL15 are connected. Each of the groups GP0 and GP3 can be configured in an identical manner because the number of groups can be four or more.

As described above, the global word lines GWLA0, GWLB0, GWLA3, and GWLB3 are provided in such a manner that two global word lines correspond to word lines located at ends of each group. Further, the global word lines GWLA0, GWLB0, GWLA3, and GWLB3 are not connected to the same word lines as each other in two groups adjacent to each other, but are connected to mutually different word lines. Meanwhile, the global word lines GWLA0, GWLB0, GWLA3, and GWLB3 are not shared by the two groups adjacent to each other, but are shared by groups that are arranged every other location. For example, the global word lines GWLA0 and GWLA3 are shared by the two groups GP0 and GP2 that are arranged every other location. The global word lines GWLB0 and GWLB3 are shared by the two groups GP1 and GP3 that are arranged every other location. Accordingly, the number of global word lines can be minimized, although a global word line for word lines at ends of each of two groups adjacent to each other is divided into two.

Further, in any two groups adjacent to each other, intermediate word lines other than word lines at both ends of the respective groups share global word lines. Furthermore, in the same group, the intermediate word lines are respectively connected to the different global word lines GWL1 and GWL2. For example, the intermediate word lines WL1, WL2, WL5, WL6, WL9, WL10, WL13, and WL14 in the groups GP0 to GP3 share the global word lines GWL1 and GWL2. Further, the word lines WL1 and WL2 in the group GP0 are connected to the global word lines GWL1 and GWL2, respectively, and the word lines WL5 and WL6 in the group GP1 are connected to the global word lines GWL1 and GWL2, respectively. This configuration is also the same for the groups GP2 and GP3. Accordingly, the number of global word lines can be minimized. Reducing the number of the global word lines can reduce the layout area of the row decoder RD.

The groups GP0 to GP3 are groups of the word lines WL connected to the mutually different global word lines GWLA0, GWLB0, GWL1, GWL2, GWLA3, and GWLB3. Further, the four global word lines GWLA0, GWLB0, GWLA3, and GWLB3 are provided to correspond to two word lines at both ends of each of the groups GP0 to GP3 (WL0, WL3, WL4, WL7, WL8, WL11, WL12, and WL15). Therefore, the number (j) of the global word lines GWLA0, GWLB0, GWL1, GWL2, GWLA3, and GWLB3 is the number (m+2) obtained by adding 2 to the number (m) of the word lines WL in each group. The number of global word lines may be larger than m+2 although the area of the row decoder RD becomes larger. That is, Expression 1 is established.

$$j \geq m+2 \quad \text{(Expression 1)}$$

Each of the four word lines WL0 to WL3, WL4 to WL7, WL8 to WL11 or WL12 to WL15 in each of the groups GP0 to GP3 is connected to any of the global word lines GWLA0, GWLB0, GWL1, GWL2, GWLA3, and GWLB3 via a corresponding one of transistors Tr0 to Tr3, Tr4 to Tr7, Tr8 to Tr11, or Tr12 to Tr15. The word lines WL0 to WL3 in the group GP0 are connected to the global word lines GWLA0, GWL1, GWL2, and GWLA3 via the transistors Tr0 to Tr3, respectively. The word lines WL4 to WL7 in the group GP1 are connected to the global word lines GWLB0, GWL1, GWL2, and GWLB3 via the transistors Tr4 to Tr7, respectively. The word lines WL8 to WL11 in the group GP2 are connected to the global word lines GWLA0, GWL1, GWL2, and GWLA3 via the transistors Tr8 to Tr11, respectively. The word lines WL12 to WL15 in the group GP3 are connected to the global word lines GWLB0, GWL1, GWL2, and GWLB3 via the transistors Tr12 to Tr15, respectively.

One of the global word lines GWLA0, GWLB0, GWL1, GWL2, GWLA3, and GWLB3 transfers the selection voltage VWL and the other five are kept at the non-selection voltage VWLU or are electrically floating. The non-selection voltage VWLU is applied to global word lines connected to unselected word lines (adjacent word lines) adjacent to a selected word line. A global word line connected to an unselected word line not adjacent to the selected word line may be electrically floating.

The transistors Tr0 to Tr15 are provided for the word lines WL0 to WL15 in one-to-one correspondence and are connected between the word lines WL0 to WL15 and the global word lines GWLA0, GWLB0, GWL1, GWL2, GWLA3, and GWLB3. The transistors Tr0 to Tr15 are each configured by a p-MOSFET (Metal Oxide Semiconductor Field Effect Transistor), for example. However, the transistors Tr0 to Tr15 may be each configured by an n-MOSFET. Further, a device other than a transistor can be used as long as it has a switching function capable of switching connection.

Selection signal lines SEL0 to SEL3 are provided to correspond to the groups GP0 to GP3, respectively, and are each connected to gate electrodes of the transistors Tr0 to Tr3, Tr4 to Tr7, Tr8 to Tr11, or Tr12 to Tr15 included in a corresponding one of the groups GP0 to GP3 in common. For example, the selection signal line SEL0 is connected to the gate electrodes of the transistors Tr0 to Tr3 in the group GP0 in common. The selection signal line SEL1 is connected to the gate electrodes of the transistors Tr4 to Tr7 in the group GP1 in common. The selection signal line SEL2 is connected to the gate electrodes of the transistors Tr8 to Tr11 in the group GP2 in common. The selection signal line SEL3 is connected to the gate electrodes of the transistors Tr12 to Tr15 in the group GP3 in common. Accordingly, the transistors Tr0 to Tr15 are driven for each of the groups GP0 to GP3. The voltage of each of the selection signal lines SEL0 to SEL3 is raised or caused to fall by the peripheral circuit PC.

For example, it is assumed that the transistors Tr0 to Tr15 are p-MOSFETs. In this case, the selection signal lines SEL0 to SEL3 are low-active. Therefore, when the group GP0 is selected, the peripheral circuit PC causes the selection signal line SEL0 to fall, thereby turning on the transistors Tr0 to Tr3 corresponding to the group GP0. Accordingly, the transistors Tr0 to Tr3 electrically connect the word lines WL0 to WL3 in the group GP0 to the global word lines GWLA0, GWL1, GWL2, and GWLA3, respectively. That is, when a selected group is GP0, the transistors Tr0 to Tr3 electrically connect the four word lines WL0 to WL3 in the selected group GP0 and the four global word lines GWLA0, GWL1, GWL2, and GWLA3 to each other, respectively. Similarly, when the group GP1 is selected, the peripheral circuit PC causes the selection signal line SEL1 to fall, thereby turning on the transistors Tr4 to Tr7 corresponding to the group GP1. Accordingly, the transistors Tr4 to Tr7 connect the word lines WL4 to WL7 in the group GP1 to the global word lines GWLB0, GWL1, GWL2, and GWLB3, respectively. That is, when a selected group is GP1, the transistors Tr4 to Tr7 electrically connect the four word lines WL4 to WL7 in the selected group GP1 and the four global word lines GWLB0, GWL1, GWL2, and GWLB3 to each other, respectively. Similarly, when the group GP2 is selected, the peripheral circuit PC causes the selection signal line SEL2 to fall, thereby turning on the transistors Tr8 to Tr11 corresponding to the group GP2. Accordingly, the transistors Tr8 to Tr11 connect the word lines WL8 to WL11 in the group GP2 to the global word lines GWLA0, GWL1, GWL2, and GWLA3, respectively. When the group GP3 is selected, the peripheral circuit PC causes the selection signal line SEL3 to fall, thereby turning on the transistors Tr12 to Tr15 corresponding to the group GP3. Accordingly, the word lines WL12 to WL15 in the group GP3 are connected to the global word lines GWLB0, GWL1, GWL2, and GWLB3, respectively.

As described above, one of the global word lines GWLA0, GWLB0, GWL1, GWL2, GWLA3, and GWLB3 has the selection voltage VWL and the other five global word lines are kept at the non-selection voltage VWLU or are electrically floating. The selection voltage VWL is applied to only one of four word lines in a selected group, and the non-selection voltage VWLU is applied to the other three word lines or the other three word lines are electrically floating. The non-selection voltage VWLU is applied to an unselected word line (adjacent word line) adjacent to a selected word line and a global word line connected to that unselected word line. An unselected word line not adjacent to the selected word line and a global word line connected to that unselected word line may be electrically floating.

According to the present embodiment, the row decoder RD fixes unselected word lines on both sides of a selected word line to the non-selection voltage VWLU. Accordingly, the influence of the selection voltage VWL of the selected word line on the unselected word lines is reduced, and memory cells connected to the unselected word lines are prevented from being disturbed.

For example, in a case of selecting an intermediate word line in each group, the unselected word lines on both sides of the selected word line are in the same group. Therefore, it suffices that only a selection signal line for the selected group is caused to fall and selection signal lines for the other unselected groups are left at a high level. In this case, the unselected word lines on both sides of the selected word line can be fixed to the non-selection voltage VWLU by voltage control for global word lines. For example, in a case where the word line WL5 in the group GP1 is selected, the selection signal line SEL1 is caused to fall to a low level and the other selection signal lines SEL0, SEL2, and SEL3 are left at a high level. Further, the global word line GWL1 is set to the selection voltage VWL and the global word lines GWLB0 and GWL2 are set to the non-selection voltage VWLU. The other global word lines GWLA0, GWLA3, and GWLB3 have the non-selection voltage VWLU or are floating. Thus, the unselected word lines WL4 and WL6 adjacent to the selected word line WL5 on both sides thereof are fixed to the non-selection voltage VWLU. Accordingly, memory cells of the unselected word lines WL4 and WL6 adjacent to the selected word line WL5 are hardly disturbed by the selection voltage VWL of the selected word line WL5. The other unselected word lines may have the non-selection voltage VWLU or be floating because they are apart from the selected word line WL5. The above descriptions are also applied to a case where any of the other intermediate word lines WL1, WL2, WL6, WL9, WL10, WL13, and WL14 is selected. That is, in a case where the selected word line WL5 is located at an intermediate position in the group GP1, the transistors Tr4 to Tr7 in the selected group GP1 electrically connect the word lines WL4 to WL7 and global word lines to each other, respectively. Meanwhile, word lines in the unselected groups GP0, GP2, and GP3 other than the selected group GP1 are not connected to global word lines and remain floating.

Meanwhile, in a case where a selected word line is located at an end of a selected group, an unselected word line adjacent to the selected word line on either side thereof belongs to another group adjacent to the selected group. Therefore, it is also necessary to cause a selection signal line for the unselected group adjacent to the selected word line to fall. That is, not only transistors of word lines in the selected group, but transistors in the unselected group (adjacent group) adjacent to the selected word line also electrically connect word lines included in that adjacent group and global word lines to each other, respectively.

Figure 4:
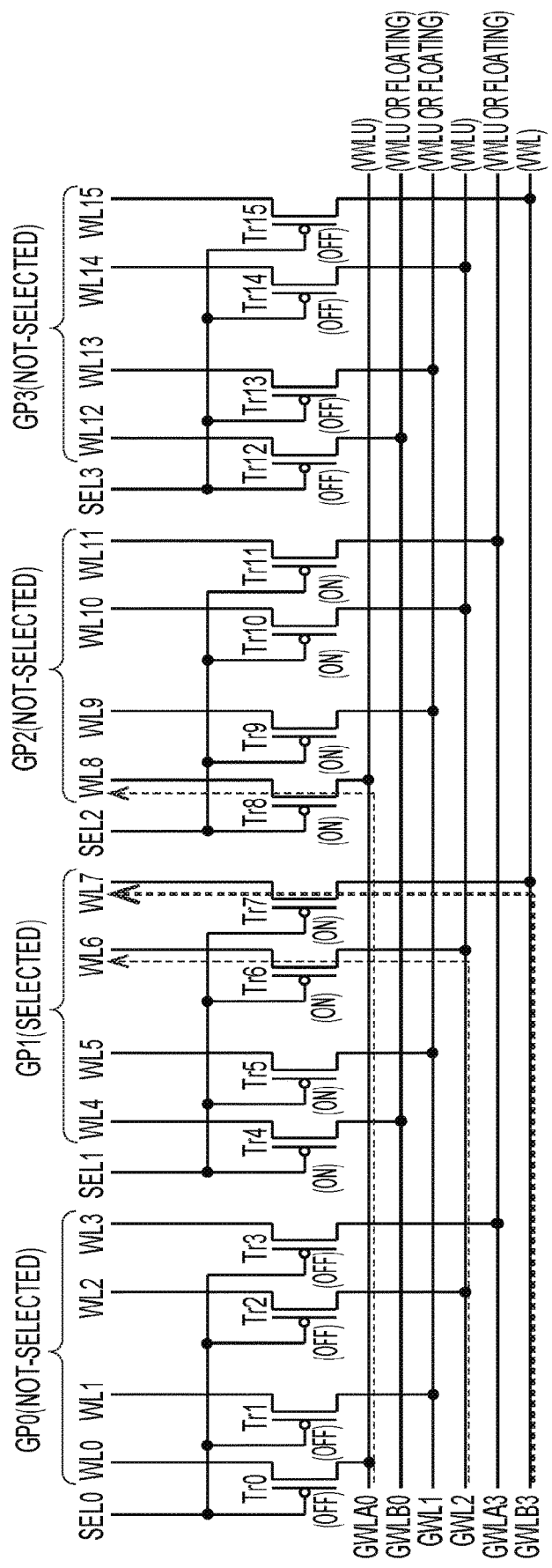
FIG. 4 is a diagram illustrating a case of selecting the word line WL7 at an end of the group.

For example, FIG. 4 is a diagram illustrating a case of selecting the word line WL7 at an end of the group GP1. In a case where the group GP1 is a selected group, the selection signal line SEL1 falls to a low level. The word line WL7 is located at an end of the selected group GP1. Therefore, the selection signal line SEL2 for the unselected group GP2 adjacent to the selected word line WL7 is also caused to fall. Accordingly, each of the word lines WL4 to WL11 in the groups GP1 and GP2 is connected to any of the global word lines GWLA0, GWLB0, GWL1, GWL2, GWLA3, and GWLB3.

At this time, the selection voltage VWL is applied to the global word line GWLB3 connected to the selected word line WL7. The non-selection voltage VWLU is applied to the global word lines GWL2 and GWLA0 connected to the unselected word lines WL6 and WL8 adjacent to the selected word line WL7. The other global word lines GWLB0, GWL1, and GWLA3 may have the non-selection voltage VWLU or be floating.

Accordingly, the selection voltage VWL is applied to the selected word line WL7, and the non-selection voltage VWLU is applied to the unselected word lines WL6 and WL8 adjacent to the selected word line WL7 on both sides thereof. The other word lines WL4, WL5, and WL9 to WL11 in the selected group GP1 and the unselected group GP2 have the non-selection voltage VWLU or are floating. Further, the selection signal lines SEL0 and SEL3 remain at a high level. Therefore, word lines in the unselected groups GP0 and GP3 are electrically disconnected from global word lines and are electrically floating. That is, unselected word lines other than the selected word line WL7 and the unselected word lines WL6 and WL8 adjacent to the selected word line WL7 on both sides thereof are electrically floating.

In this manner, the two unselected word lines WL6 and WL8 adjacent to the selected word line WL7 are fixed to the non-selection voltage VWLU. Accordingly, capacity coupling between the selected word line WL7 and the unselected word lines WL6 and WL8 is prevented, and the selection voltage VWL of the selected word line WL7 does not affect the unselected word lines WL6 and WL8 adjacent thereto so much. As a result, memory cells connected to the unselected word lines WL6 and WL8 are prevented from being disturbed. The other unselected word lines WL0 to WL5 and WL9 to WL15 may be fixed to the non-selection voltage VWLU or be floating, because they are not directly adjacent to the selected word line WL7.

Here, a global word line corresponding to the word lines WL0, WL4, WL8, and WL12 at one ends of the respective groups GP0 to GP3 is divided into the two global word lines GWLA0 and GWLB0. A global word line corresponding to the word lines WL3, WL7, WL11, and WL15 at the other ends of the respective groups GP0 to GP3 is also divided into the two global word lines GWLA3 and GWLB3.

Although not illustrated, in a case where a global word line corresponding to the word lines WL3, WL7, WL11, and WL15 at the other ends of the respective groups GP0 to GP3 is one (which is assumed as GWL3), the word lines WL3, WL7, WL11, and WL15 are connected to the one common global word line GWL3. In this case, when the word line WL7 at the other end of the group GP1 is selected, the global word line GWL3 is connected not only to the selected word line WL7 but also to the word line WL11 in the unselected group GP2. Therefore, when the word lines WL8 to WL11 in the unselected group GP2 adjacent to the selected word line WL7 are connected to global word lines, the selection voltage VWL of the global word line GWL3 is applied not only to the selected word line WL7 but also to the unselected word line WL11. In this case, memory cells connected to the unselected word line WL11 are disturbed.

This phenomenon also occurs in an identical manner in a case where the word line WL4 at one end of the group GP1 is selected. In a case where the global word line corresponding to the word lines WL0, WL4, WL8, and WL12 at one ends of the respective groups GP0 to GP3 is one (which is assumed as GWL0), the word lines WL0, WL4, WL8, and WL12 are connected to the one common global word line GWL0. In this case, when the word line WL4 at one end of the group GP1 is selected, the global word line GWL0 is connected not only to the selected word line WL4 but also to the word line WL0 in the unselected group GP0. Therefore, when the word lines WL0 to WL3 in the unselected group GP0 adjacent to the selected word line WL4 is connected to global word lines, the selection voltage VWL of the global word line GWL0 is applied not only to the selected word line WL4 but also to the unselected word line WL0. In this case, memory cells connected to the unselected word line WL0 are disturbed.

Meanwhile, in the semiconductor storage device according to the present embodiment, the global word line corresponding to the word lines WL0, WL4, WL8, and WL12 at one ends of the respective groups GP0 to GP3 is divided into the two global word lines GWLA0 and GWLB0. Further, the global word line corresponding to the word lines WL3, WL7, WL11, and WL15 at the other ends of the respective groups GP0 to GP3 is also divided into the two global word lines GWLA3 and GWLB3. Word lines at ends of any two groups that are adjacent to each other are connected to global word lines (GWLA0, GWLB0, GWLA3, and GWLB3) different from each other. Therefore, even if word lines in an unselected group adjacent to a selected group are connected to global word lines, the selection voltage VWL is not applied to an unselected word line other than a selected word line. For example, in order to fix the two unselected word lines WL6 and WL8 adjacent to the selected word line WL7 to the non-selection voltage VWLU in FIG. 3, the word lines WL8 to WL11 in the adjacent unselected group GP2 are connected to global word lines. In this case, the selected word line WL7 and the unselected word line WL11 are respectively connected to the mutually different global word lines GWLB3 and GWLA3, respectively. Therefore, the selection voltage VWL is applied to the selected word line WL7 only, and is not applied to the unselected word line WL11. Accordingly, it is possible to prevent memory cells connected to the unselected word line WL11 from being disturbed, with the unselected word lines WL6 and WL8 adjacent to the selected word line WL7 fixed to the non-selection voltage VWLU.

This is also the same in a case where the selected word line is WL4. In order to fix the two unselected word lines WL3 and WL5 adjacent to the selected word line WL4 to the non-selection voltage VWLU, the word lines WL0 to WL3 in the adjacent unselected group GP0 are connected to global word lines. In this case, the selected word line WL4 and the unselected word line WL0 are respectively connected to the mutually different global word lines GWLB0 and GWLA0. Therefore, the selection voltage VWL is applied to the selected word line WL4 only, and is not applied to the unselected word line WL0. Accordingly, it is possible to prevent memory cells connected to the unselected word line WL0 from being disturbed, while the unselected word lines WL3 and WL5 adjacent to the selected word line WL4 are fixed to the non-selection voltage VWLU.

In the present embodiment, an example in which the total number of word lines (bit lines) is 16 and the word lines are divided into four groups has been described for simplicity. In this case, each group is formed by four word lines. However, more word lines can be configured as one group. For example, in a case where 1024 word lines are divided into 32 groups, the number m of the word lines in each group is 32. In this case, it suffices that at least 34 global word lines are provided. Therefore, the layout area of the semiconductor storage device according to the present embodiment does not largely increase even if the total number of the word lines (bit lines) increases, and the influence on the chip size of the semiconductor storage device is small. In other words, in the semiconductor storage device according to the present embodiment, it is possible to suppress the influence of increase of the total number of the word lines (bit lines) on the chip size to be relatively small. Therefore, the semiconductor storage device according to the present embodiment can suppress increase of the area and can also prevent an unselected word line from being disturbed (subjected to voltage fluctuation) by a selection voltage.

Here, a global word line corresponding to end word lines located at one ends or the other ends of the respective groups GP0 to GP3 is divided into two. However, the global word line corresponding to the end word lines may be divided into three or more, as long as no global word line is shared by adjacent groups.

The configurations and the functions described above can be also applied not only to the row decoder RD but also to the column decoder CD. In a case where the configurations and the functions described above are applied to the column decoder CD, it suffices that "word line" is replaced with "bit line".

(Modification)

Figure 5:
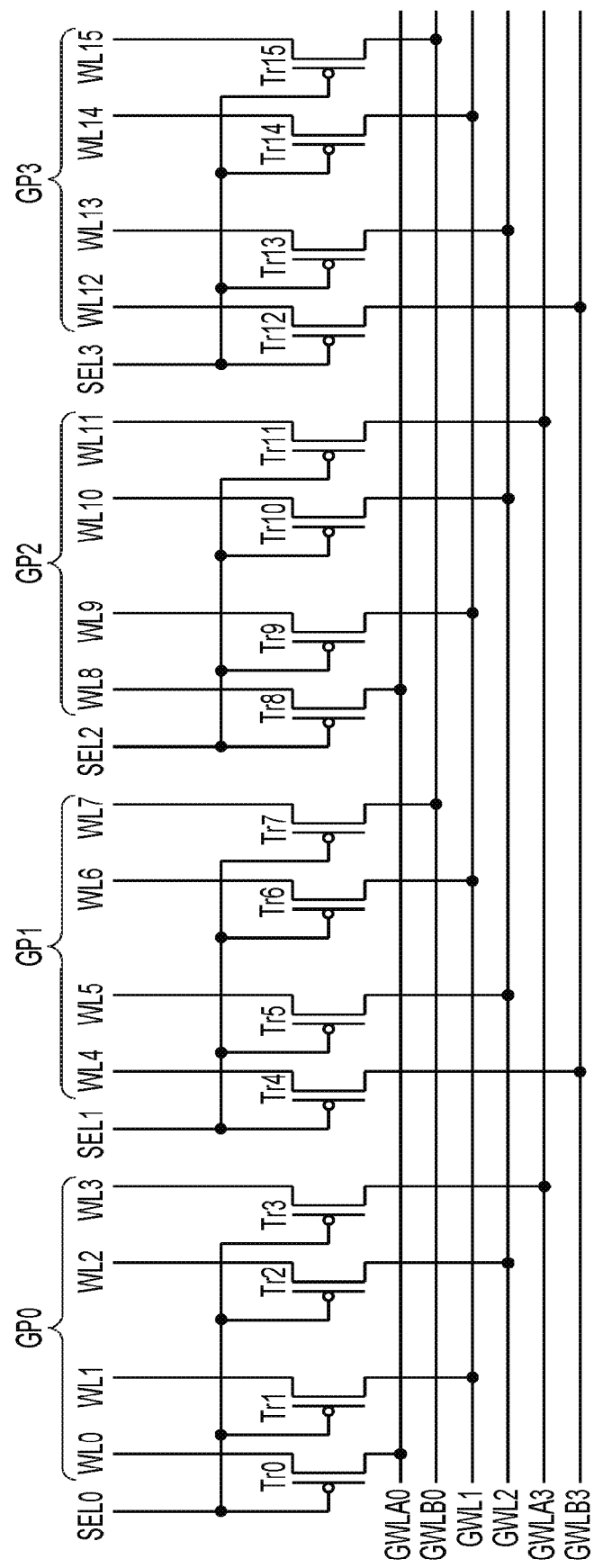
FIG. 5 is a circuit diagram illustrating a configuration example of a multiplexer in a row decoder according to a modification of the first embodiment.

FIG. 5 is a circuit diagram illustrating a configuration example of a multiplexer MUX in a row decoder RD according to a modification of the first embodiment. In the present modification, a relation of connection between word lines in the groups GP1 and GP3 and global word lines is different from that in the first embodiment. In the group GP0, the word lines WL0 to WL3 are connected to global word lines in an ascending order (in the order of GWLA0, GWL1, GWL2, and GWLA3), respectively. Similarly, in the group GP2, word lines are connected to global word lines in an ascending order. Meanwhile, in the group GP1, the word lines WL4 to WL7 are connected to global word lines in a descending order (in the order of GWLB3, GWL2, GWL1, and GWLB0), respectively.

The present modification is identical to the first embodiment in that a global word line corresponding to end word lines located at one ends or the other ends of the respective groups GP0 to GP3 is divided into two. Even with this configuration, identical operation as that in the first embodiment can be performed.

For example, in a case of selecting the word line WL7 in the group GP1, the groups GP1 and GP2 are connected to global word lines. Further, the global word line GWLB0 connected to the selected word line WL7 is set to the selection voltage VWL. The global word lines GWL1 and GWLA0 connected to the unselected word lines WL6 and WL8 adjacent to the selected word line WL7 are set to the non-selection voltage VWLU. The other global word lines may have the non-selection voltage VWLU or be floating. Accordingly, the unselected word lines WL6 and WL8 adjacent to the selected word line WL7 are fixed to the non-selection voltage VWLU, while the selection voltage VWL is applied to the selected word line WL7. Therefore, memory cells connected to the unselected word lines WL6 and WL8 are hardly disturbed (subjected to voltage fluctuation) by the selected word line WL7. Further, the other unselected word lines are hardly disturbed (subjected to voltage fluctuation) by the selected word line WL7 although they are electrically floating, because they are apart from the selected word line WL7.

Other configurations and operations according to the present modification can be easily understood from the configurations and operations according to the first embodiment. Therefore, the present modification can attain effects identical to those of the first embodiment.

Second Embodiment

Figure 6:
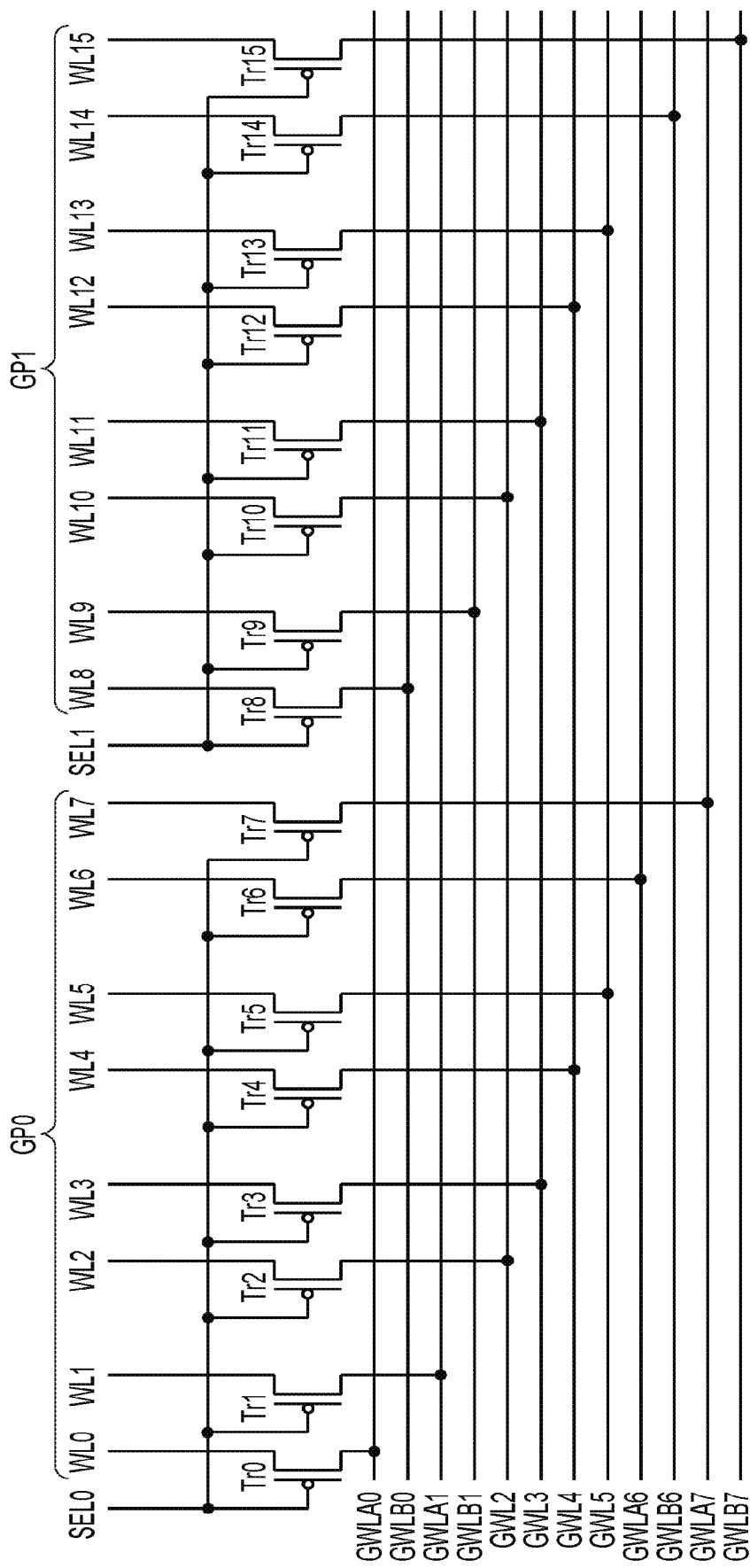
FIG. 6 is a circuit diagram illustrating a configuration example of a multiplexer in a row decoder according to a second embodiment.

FIG. 6 is a circuit diagram illustrating a configuration example of a multiplexer MUX in a row decoder RD according to a second embodiment. The row decoder RD according to the second embodiment fixes unselected word lines that are two each on both sides of a selected word line and are adjacent thereto (four unselected word lines in total) to the non-selection voltage VWLU. The other unselected word lines may have the non-selection voltage VWLU or be floating.

In the second embodiment, 16 word lines WL are divided into two groups GP0 and GP1 each including eight word lines WL. That is, m=8 is established in the second embodiment.

Global word lines GWLA0, GWLB0, GWLA1, GWLB1, GWL2 to GWL5, GWLA6, GWLB6, GWLA7, and GWLB7 as global signal lines are provided for all the word lines WL (all the groups GP0 and GP1) in common. The number of the provided global word lines GWLA0, GWLB0, GWLA1, GWLB1, GWL2 to GWL5, GWLA6, GWLB6, GWLA7, and GWLB7 is the number obtained by adding 4 to the number of the word lines WL in each group (that is, m+4). For example, in the present embodiment, eight word lines WL are included in each of the groups GP0 and GP1, and 12 global word lines GWLA0, GWLB0, GWLA1, GWLB1, GWL2 to GWL5, GWLA6, GWLB6, GWLA7, and GWLB7 are provided for the groups GP0 and GP1 in common.

The global word lines GWLA0 and GWLB0 respectively correspond to word lines located at one ends of two groups that are adjacent to each other. For example, the global word line GWLA0 corresponds to the word line WL0 at one end of the group GP0 and is connected to the word line WL0 via the transistor Tr0. The global word line GWLB0 corresponds to the word line WL8 at one end of the group GP1 adjacent to the group GP0 and is connected to the word line WL8 via the transistor Tr8.

The global word lines GWLA1 and GWLB1 respectively correspond to the second word lines from the one ends of the two groups adjacent to each other. For example, the global word line GWLA1 corresponds to the second word line WL1 from the one end of the group GP0 and is connected to the word line WL1 via the transistor Tr1. The global word line GWLB1 corresponds to the second word line WL9 from the one end of the group GP1 adjacent to the group GP0 and is connected to the word line WL9 via the transistor Tr9.

The global word lines GWLA7 and GWLB7 respectively correspond to word lines located at the other ends of the two groups adjacent to each other. For example, the global word line GWLA7 corresponds to the word line WL7 at the other end of the group GP0 and is connected to the word line WL7 via the transistor Tr7. The global word line GWLB7 corresponds to the word line WL15 at the other end of the group GP1 adjacent to the group GP0 and is connected to the word line WL15 via the transistor Tr15.

The global word lines GWLA6 and GWLB6 respectively correspond to the second word lines from the other ends of the two groups adjacent to each other. For example, the global word line GWLA6 corresponds to the second word line WL6 from the other end of the group GP0 and is connected to the word line WL6 via the transistor Tr6. The global word line GWLB6 corresponds to the second word line WL14 from the other end of the group GP1 adjacent to the group GP0 and is connected to the word line WL14 via the transistor Tr14.

The word lines WL0, WL1, WL6, and WL7 that are two each on both sides in the group GP0 are connected to different global word lines, respectively, and do not share global word lines with the word lines WL8, WL9, WL14, and WL15 that are two each on both sides in the group GP1 adjacent to the group GP1.

As described above, the global word lines GWLA0, GWLB0, GWLA1, GWLB1, GWLA6, GWLB6, GWLA7, and GWLB7 are provided for two word lines on each side in the respective groups. Further, the global word lines GWLA0, GWLB0, GWLA1, GWLB1, GWLA6, GWLB6, GWLA7, and GWLB7 are not connected to the same word lines as each other in two groups adjacent to each other, but are connected to mutually different word lines. The global word lines GWLA0, GWLB0, GWLA1, GWLB1, GWLA6, GWLB6, GWLA7, and GWLB7 are not shared by two groups adjacent to each other but may be shared by groups that are arranged every other location. Accordingly, the number of global word lines can be minimized although global word lines are divided with respect to two word lines on each side in each of two groups adjacent to each other.

Further, the intermediate word lines WL2 to WL5 and WL10 to WL13 other than word lines at both ends of the respective groups share the global word lines GWL2 to GWL5 in any two groups adjacent to each other. Furthermore, in the same group, word lines are connected to the different global word lines GWL2 to GWL5, respectively. For example, the intermediate word lines WL2 to WL5 in the group GP0 are connected to the global word lines GWL2 to GWL5, respectively, and the intermediate word lines WL10 to WL13 in the group GP1 are connected to the global word lines GWL2 to GWL5, respectively. The word lines WL2 and WL10 in the groups GP0 and GP1 are connected to the global word line GWL2 in common, the word lines WL3 and WL11 are connected to the global word line GWL3 in common, the word lines WL4 and WL12 are connected to the global word line GWL4 in common, and the word lines WL5 and WL13 are connected to the global word line GWL5 in common.

The groups GP0 and GP1 are groups of the word lines WL connected to the mutually different global word lines GWLA0, GWLB0, GWLA1, GWLB1, GWL2 to GWL5, GWLA6, GWLB6, GWLA7, and GWLB7. Further, the eight global word lines GWLA0, GWLB0, GWLA1, GWLB1, GWLA6, GWLB6, GWLA7, and GWLB7 are provided to correspond to the two word lines on each side in each of the groups GP0 and GP1 (WL0, WL1, WL6, WL7, WL8, WL9, WL14, and WL15). Therefore, the number (j) of global word lines is equal to or larger than the number (m+4) obtained by adding 4 to the number (m in Expression 2 described below) of the word lines WL in each group. That is, Expression 2 is established.

$$j \geq m+4 \quad \text{(Expression 2)}$$

Each of the word lines WL0 to WL7 or WL8 to WL15 in each of the groups GP0 and GP1 is connected to any of the global word lines GWLA0, GWLB0, GWLA1, GWLB1, GWL2 to GWL5, GWLA6, GWLB6, GWLA7, and GWLB7 via a corresponding one of the transistors Tr0 to Tr15. The transistors Tr0 to Tr15 are provided for the word lines WL0 to WL15 in one-to-one correspondence, and are connected between the word lines WL0 to WL15 and the global word lines GWLA0, GWLB0, GWLA1, GWLB1, GWL2 to GWL5, GWLA6, GWLB6, GWLA7, and GWLB7. The configurations of the transistors Tr0 to Tr15 may be identical to those of the first embodiment.

One of the global word lines GWLA0, GWLB0, GWLA1, GWLB1, GWL2 to GWL5, GWLA6, GWLB6, GWLA7, and GWLB7 transfers the selection voltage VWL and the other global word lines are kept at the non-selection voltage VWLU or are electrically floating. In the second embodiment, the non-selection voltage VWLU is applied to global word lines connected to unselected word lines that are two each on both sides of a selected word line and are adjacent thereto (adjacent word lines). A global word line connected to an unselected word line that is further apart from the selected word line may be electrically floating.

The selection signal lines SEL0 and SEL1 are provided to correspond to the groups GP0 and GP1, respectively, and are each connected to gate electrodes of the transistors Tr0 to Tr7 or Tr8 to Tr15 in a corresponding one of the groups GP0 or GP1 in common. Accordingly, the transistors Tr0 to Tr15 are driven for each of the groups GP0 and GP1. The voltage of each of the selection signal lines SEL0 and SEL1 is raised or caused to fall by the peripheral circuit PC. The selection signal lines SEL0 and SEL1 are low-active.

According to the second embodiment, the row decoder RD fixes two unselected word lines on both sides of a selected word line to the non-selection voltage VWLU. Accordingly, the influence of the selection voltage VWL of the selected word line on the unselected word lines is reduced, and memory cells connected to the unselected word lines are prevented from being disturbed.

For example, in a case of selecting an intermediate word line other than two word lines on both sides in each group, two unselected word lines on both sides of the selected word line are in the same group. Therefore, it suffices that only a selection signal line for the selected group is caused to fall and a selection signal line for the other unselected group remains at a high level. In this case, the unselected word lines on both sides of the selected word line can be fixed to the non-selection voltage VWLU by voltage control for global word lines. For example, in a case where the word line WL3 in the group GP0 is selected, the selection signal line SEL0 is caused to fall to a low level and the other selection signal line SEL1 is left at as high level. Further, the global word line GWL3 is set to the selection voltage VWL and the global word lines GWLA1, GWL2, GWL4, and GWL5 are set to the non-selection voltage VWLU. The other global word lines have the non-selection voltage VWLU or are floating. Thus, the unselected word lines WL1, WL2, WL4, and WL5 adjacent to the selected word line WL3 on both sides are fixed to the non-selection voltage VWLU. Accordingly, memory cells of the unselected word lines WL1, WL2, WL4, and WL5 that are two each on both sides of the selected word line WL3 and are adjacent thereto are hardly disturbed by the selection voltage VWL of the selected word line WL3. The other unselected word lines may have the non-selection voltage VWLU or be floating, because they are apart from the selected word line WL3. The above descriptions are also applied to a case where any of the other intermediate word lines WL2, WL4, WL5, and WL10 to WL13 is selected.

Meanwhile, in a case where a selected word line is included in two word lines on both sides in a selected group, at least one of two unselected word lines adjacent to the selected word line on either side belongs to another group adjacent to the selected group. Therefore, it is also necessary to cause a selection signal line for the unselected group adjacent to the selected word line to fall. That is, not only word lines in the selected group but also word lines in the unselected group adjacent thereto are connected to global word lines.

Figure 7:
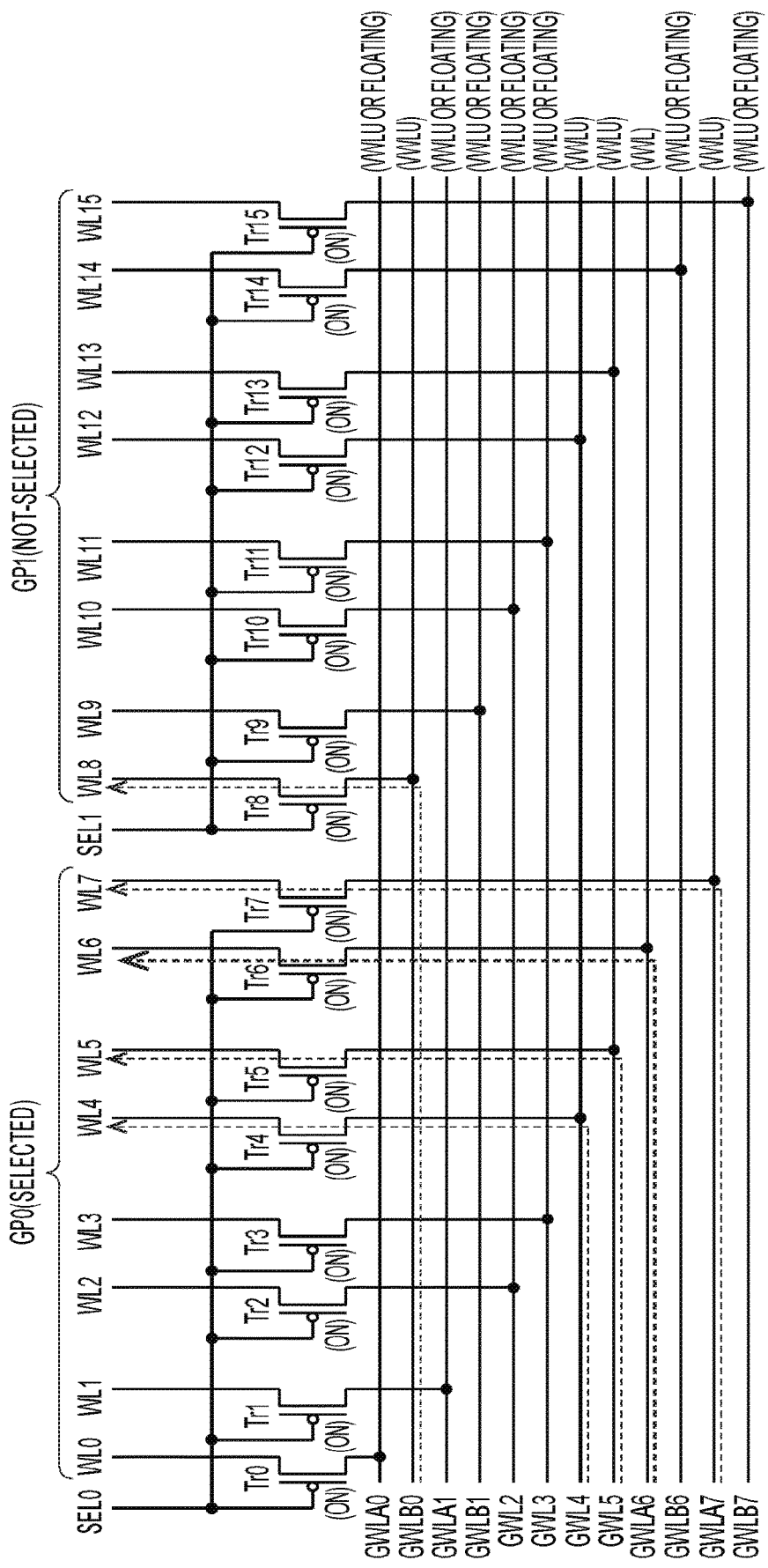
FIG. 7 is a diagram illustrating a state in a case of selecting the second word line WL6 from an end of the group.

For example, FIG. 7 is a diagram illustrating a state in a case of selecting the second word line WL6 from an end of the group GP0. In case where the group GP0 is a selected group, the selection signal line SEL0 falls to a low level. The word line WL6 is the second word line from an end of the selected group GP0. Therefore, the selection signal line SEL1 for the unselected group GP1 adjacent to the selected word line WL6 is also caused to fall. Accordingly, each of the word lines WL0 to WL15 in the groups GP0 and GP1 is connected to any of the global word lines GWLA0, GWLB0, GWLA1, GWLB1, GWL2 to GWL5, GWLA6, GWLB6, GWLA7, and GWLB7.

At this time, the selection voltage VWL is applied to the global word line GWLA6 connected to the selected word line WL6. The non-selection voltage VWLU is applied to the global word lines GWLB0, GWL4, GWL5, and GWLA7 connected to the unselected word lines WL4, WL5, WL7, and WL8 that are two each on both sides of the selected word line WL6 and are adjacent thereto. The other global word lines may have the non-selection voltage VWLU or be floating.

Accordingly, the selection voltage VWL is applied to the selected word line WL6, and the non-selection voltage VWLU is applied to the unselected word lines WL4, WL5, WL7, and WL8 that are two each on both sides of the selected word line WL6 and are adjacent thereto. The other word lines WL0 to WL3 and WL9 to WL15 have the non-selection voltage VWLU or are floating. A selection signal line for another unselected group remains at a high level, although not illustrated. Therefore, unselected word lines in a group other than the groups GP0 and GP1 are electrically disconnected from global word lines and are electrically floating. That is, unselected word lines other than the selected word line WL6 and the unselected word lines WL4, WL5, WL7, and WL8 that are two each on both sides of the selected word line WL6 and are adjacent thereto are electrically floating.

In this manner, the unselected word lines WL4, WL5, WL7, and WL8 that are two each on both sides of the selected word line WL6 and are adjacent thereto are fixed to the non-selection voltage VWLU. Accordingly, capacity coupling between the selected word line WL6 and the unselected word lines WL4, WL5, WL7, and WL8 is prevented, and the selection voltage VWL of the selected word line WL6 does not affect the unselected word lines WL4, WL5, WL7, and WL8 adjacent thereto so much. As a result, memory cells connected to the unselected word lines WL4, WL5, WL7, and WL8 are prevented from being disturbed. The other unselected word lines WL0 to WL3 and WL9 to WL15 may be fixed to the non-selection voltage VWLU or be floating, because they are apart from the selected word line WL6.

Here, a global word line corresponding to the word lines WL0 and WL8 at one ends of the respective groups GP0 and GP1 is divided into the two global word lines GWLA0 and GWLB0. A global word line corresponding to the second word lines WL1 and WL9 from the one ends of the respective groups GP0 and GP1 is divided into the two global word lines GWLA1 and GWLB1. Also, a global word line corresponding to the word lines WL7 and WL15 at the other ends of the respective groups GP0 and GP1 is divided into the two global word lines GWLA7 and GWLB7. A global word line corresponding to the second word lines WL6 and WL14 from the other ends of the respective groups GP0 and GP1 is also divided into the two global word lines GWLA6 and GWLB6.

Accordingly, two word lines on both sides in each of the two groups GP0 and GP1 adjacent to each other are connected to mutually different global word lines (GWLA0, GWLB0, GWLA1, GWLB1, GWLA6, GWLB6, GWLA7, and GWLB7). Therefore, even if word lines in an unselected group adjacent to a selected group are connected to global word lines, the selection voltage VWL is not applied to an unselected word line other than a selected word line. For example, in order to fix the unselected word lines WL4, WL5, WL7, and WL8 that are two each on both sides of the selected word line WL6 and are adjacent thereto to the non-selection voltage VWLU in FIG. 7, the word lines WL8 to WL15 in the adjacent unselected group GP1 are connected to global word lines. In this case, the selected word line WL6 is connected to a global word line different from the global word lines to which the unselected word lines WL8 to WL15 in the group GP1 are connected. Therefore, the selection voltage VWL is applied to the selected word line WL6 only, and is not applied to the unselected word lines WL8 to WL15 in the group GP1. Accordingly, memory cells in the group GP1 are not disturbed.

This is also the same in a case where any one of word lines that are two on both sides in each of the two groups GP0 and GP1 adjacent to each other is selected.

Other configurations and operations according to the second embodiment may be identical to those according to the first embodiment. Therefore, the second embodiment can attain effects identical to those of the first embodiment.

Further, according to the second embodiment, each group is formed by eight word lines. However, it is also possible to configure each group to include more word lines. In a case where 1024 word lines are divided into 32 groups, for example, the number of word lines in each group is 32. In this case, it suffices that at least 36 global word lines are provided. Therefore, the layout area of the semiconductor storage device according to the present embodiment does not largely increase, and the influence on the chip size of the semiconductor storage device is small.

(Modification)

Figure 8:
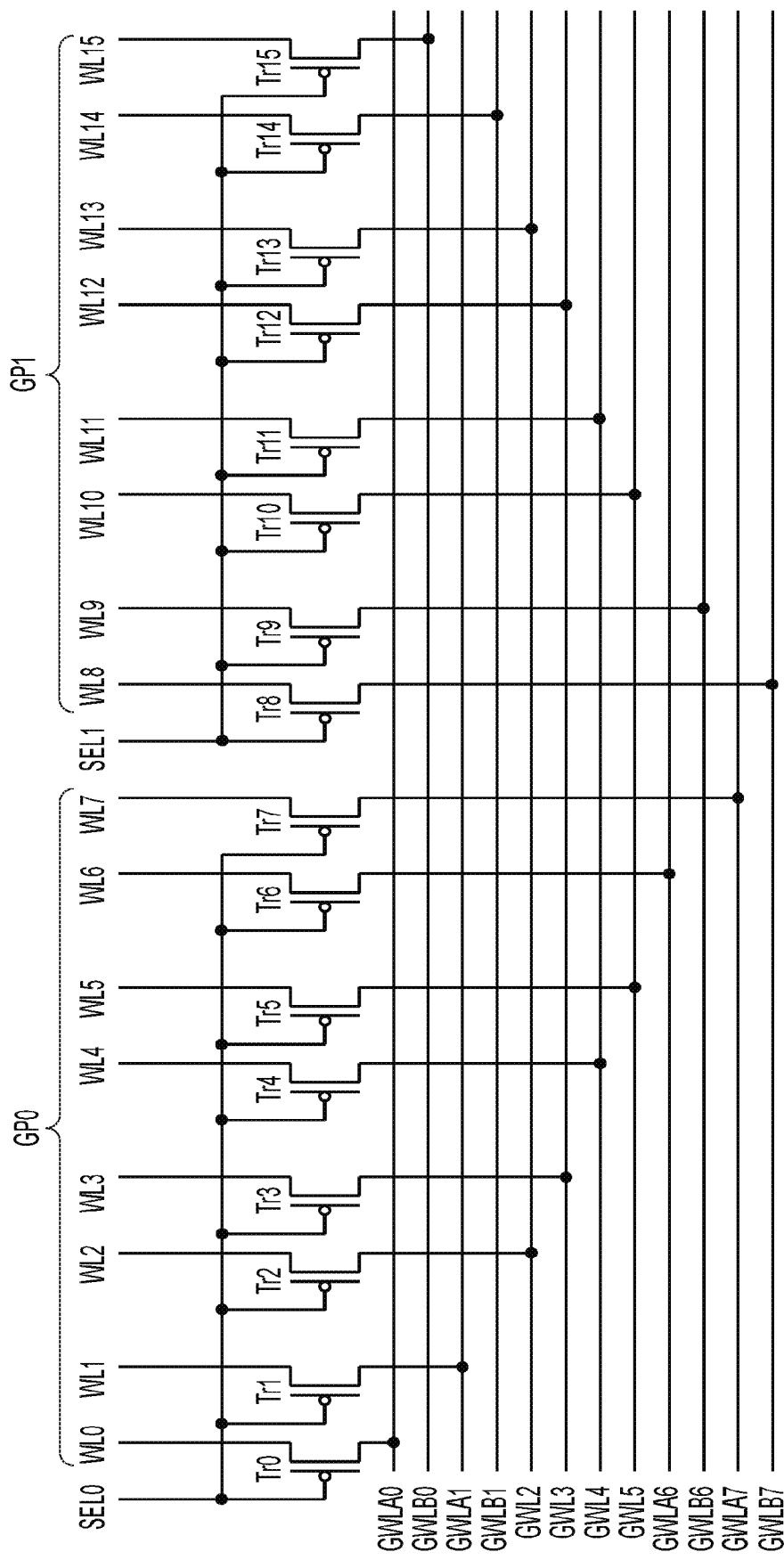
FIG. 8 is a circuit diagram illustrating a configuration example of a multiplexer in a row decoder according to a modification of the second embodiment.

FIG. 8 is a circuit diagram illustrating a configuration example of a multiplexer MUX in a row decoder RD according to a modification of the second embodiment. In the present modification, a relation of connection between word lines in the group GP1 and global word lines is different from that in the second embodiment. In the group GP0, the word lines WL0 to WL7 are connected to global word lines in an ascending order (in the order of GWLA0, GWLA1, GWL2 to GWL5, GWLA6, and GWLA7), respectively. Meanwhile, in the group GP1, the word lines WL8 to WL15 are connected to global word lines in a descending order (in the order of GWLB7, GWLB6, GWL5, GWL4, GWL3, GWL2, GWLB1, and GWLB0), respectively.

The present modification is identical to the second embodiment in that global word lines corresponding to two word lines at one end or the other end of each of the groups GP0 and GP1 are divided into four (eight in total). With this configuration, identical operations as those in the second embodiment can be also performed.

For example, in a case of selecting the word line WL6 in the group GP0, the groups GP0 and GP1 are connected to global word lines. Further, the global word line GWLA6 connected to the selected word line WL6 is set to the selection voltage VWL. The global word lines GWL4, GWL5, GWLA7, and GWLB7 connected to the unselected word lines WL4, WL5, WL7 and WL8 that are two each on both sides of the selected word line WL6 and are adjacent thereto are set to the non-selection voltage VWLU. The other global word lines may have the non-selection voltage VWLU or be floating. Accordingly, the unselected word lines WL4, WL5, WL7, and WL8 that are two each on both sides of the selected word line WL6 and are adjacent thereto are fixed to the non-selection voltage VWLU, while the selection voltage VWL is applied to the selected word line WL6. Consequently, memory cells connected to the unselected word lines WL4, WL5, WL7, and WL8 are hardly disturbed by the selected word line WL6. Further, the other unselected word lines are hardly disturbed (subjected to voltage fluctuation) by the selected word line WL6 although they are electrically floating, because they are apart from the selected word line WL6.

Other configurations and operations according to the present modification can be easily understood from the configurations and operations according to the second embodiment. Therefore, the present modification can attain effects identical to those of the second embodiment.

The above embodiments can be applied to a cross-point memory described below.

Figure 9:
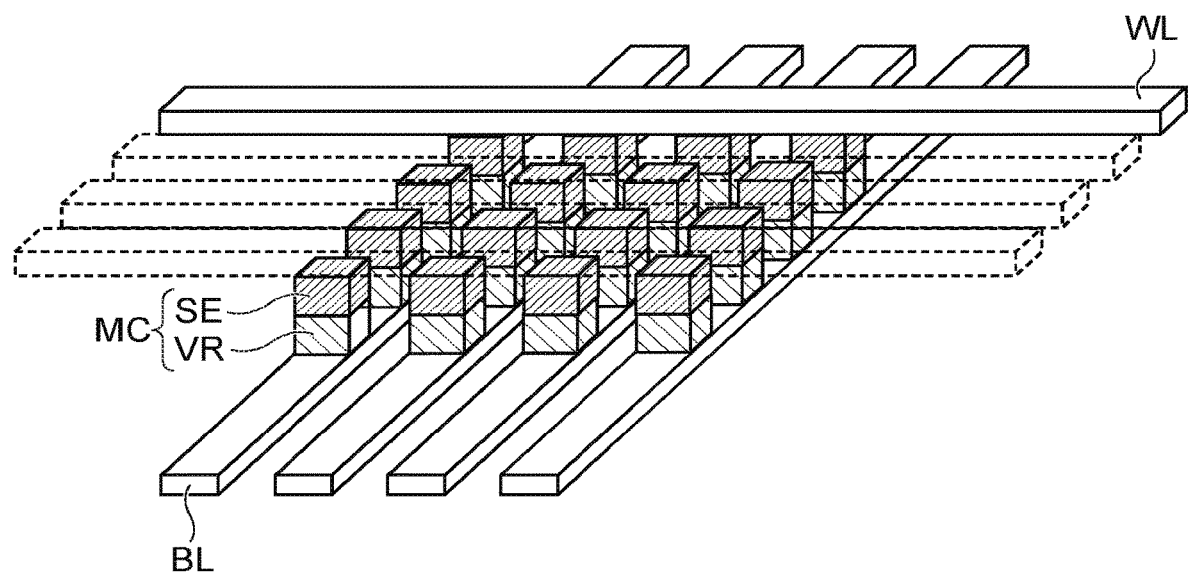
FIG. 9 is a perspective view schematically illustrating memory cells, bit lines, and word lines included in a memory cell array.

FIG. 9 is a perspective view schematically illustrating memory cells MC, bit lines BL, and word lines WL included in a memory cell array MCA.

As illustrated in FIG. 9, the bit lines BL extend in the same direction as each other with an interval therebetween, and the word lines WL extend with an interval therebetween above the bit lines BL in a direction perpendicular to the extending direction of the bit lines BL. The memory cells MC are respectively arranged at intersections of the bit lines BL and the word lines WL. With this configuration, the cross-point memory cell array MCA is configured in which the memory cells MC are arranged in a matrix in plan view.

An example in which the bit lines BL and the word lines WL each form one layer and the memory cells MC forming one layer is arranged therebetween has been described. However, the arrangement is not limited thereto. Layers in which the memory cells MC are arranged may be further increased, and layers of the bit lines BL and/or layers of the word lines WL may be further increased correspondingly. For example, the bit lines BL extending with an interval therebetween in a direction perpendicular to the extending direction of the word lines WL may be further provided above the word lines WL in FIG. 9, and the memory cells MC may be further arranged at intersections of the word lines WL and the bit lines BL above the word lines WL. In this case, layers of the memory cells MC are two layers, and wiring layers (layers of the bit lines BL and the layer of the word lines WL) are three layers. Further, the bit lines BL and the word lines WL may be exchanged with each other.

Figure 10:
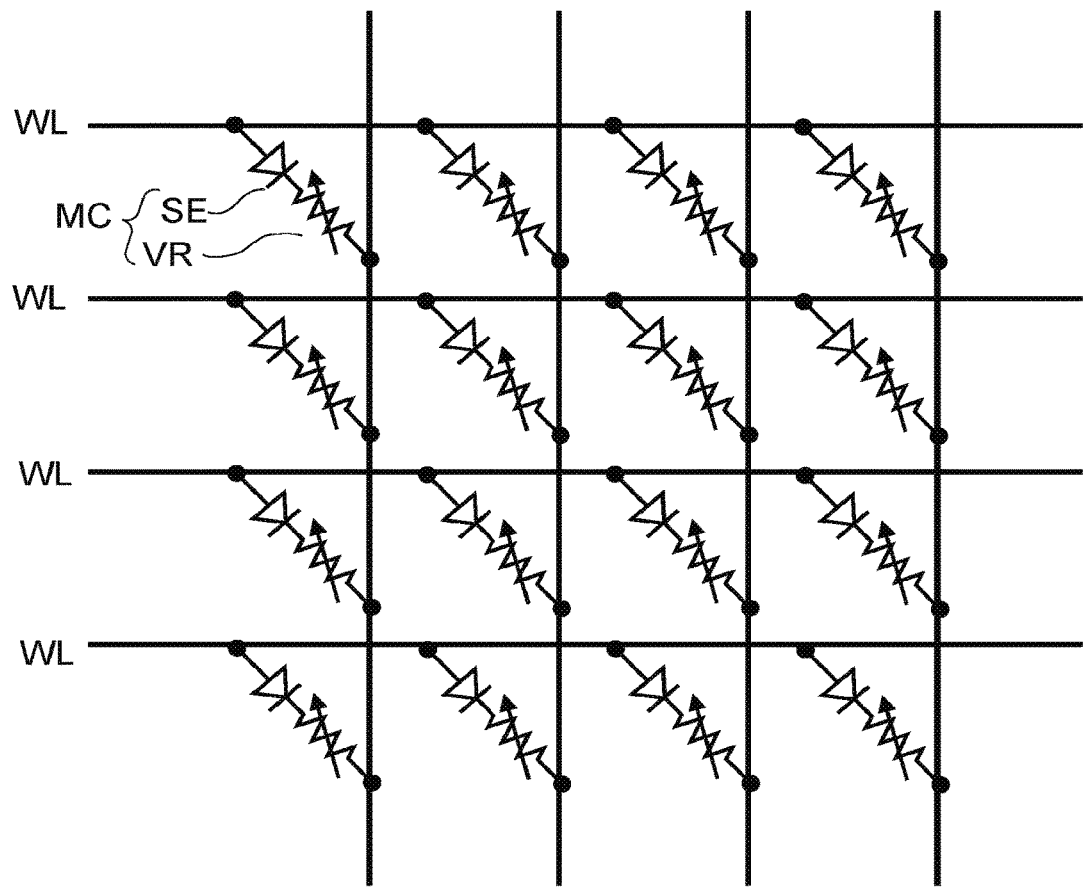
FIG. 10 is a diagram schematically illustrating a circuit configuration of the memory cell array.

FIG. 10 is a diagram schematically illustrating a circuit configuration of the memory cell array MCA. Each memory cell MC is connected between a corresponding one of the word lines WL and a corresponding one of the bit lines BL. The memory cell MC includes a variable resistance element VR and a switching element SE, for example. The memory cell MC is not limited to a variable resistance element.

The variable resistance element VR can be placed in a low resistance state and a high resistance state. The variable resistance element VR holds 1-bit data by using the difference of a resistance state between the low resistance state and the high resistance state.

The switching element SE is placed in a high resistance state (off state) when a voltage applied thereto is lower than a threshold voltage, and in a conducting state (on state) when the applied voltage is equal to or higher than the threshold voltage. Accordingly, the switching element SE serves as a rectifier element having a rectifying function. The switching element SE may be a bidirectional rectifier element.

Figure 11:
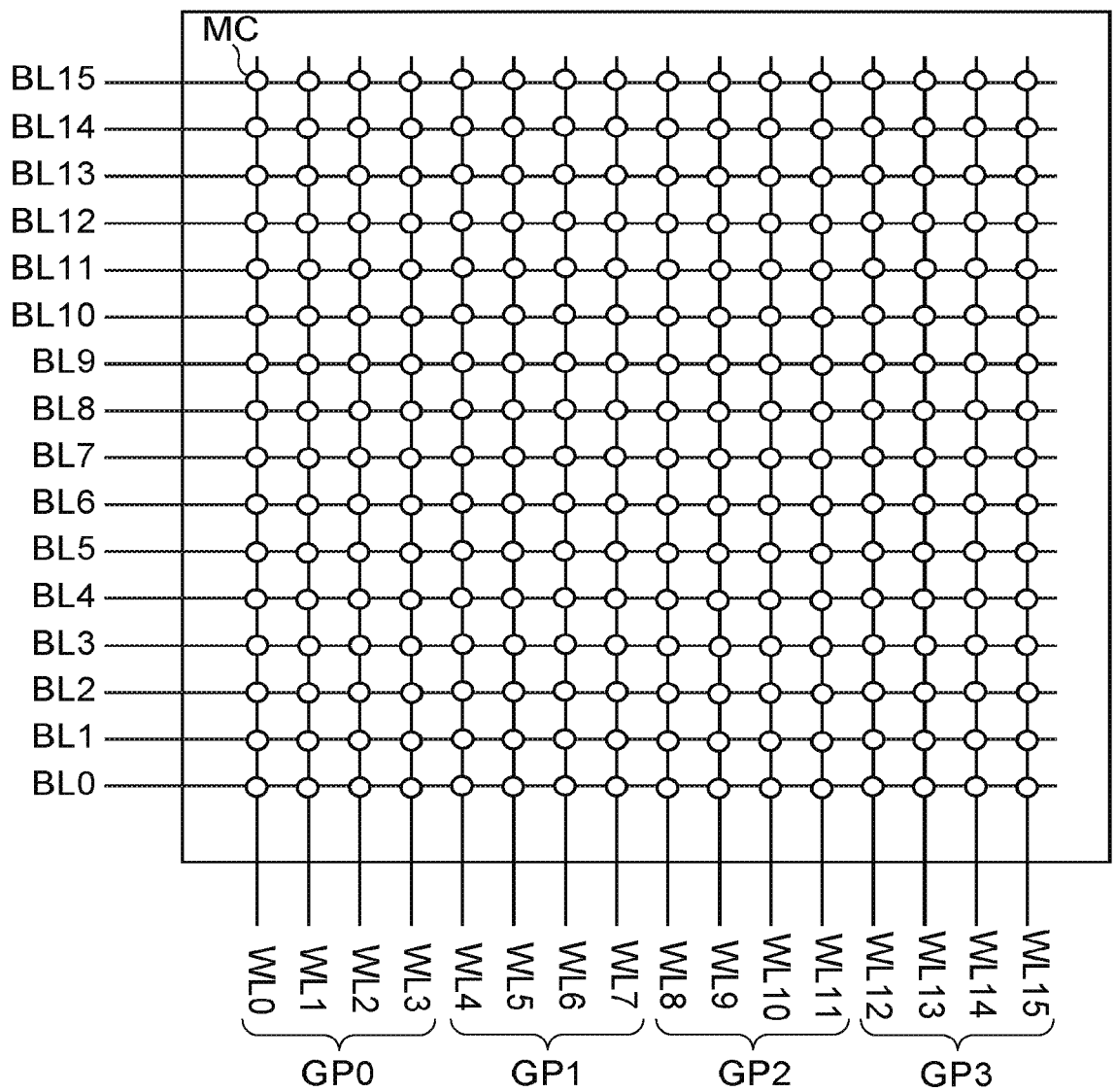
FIG. 11 is a diagram schematically illustrating a relation of connection between the memory cell array, the bit lines, and the word lines.

FIG. 11 is a diagram schematically illustrating a relation of connection between the memory cell array MCA, the bit lines BL, and the word lines WL. For example, 16 bit lines BL and 16 word lines WL are connected to the memory cell array MCA. The bit lines BL and the word lines WL are each divided into four groups GP each including four lines. Although an example in which the total number of the bit lines BL and the total number of the word lines WL are 16 has been described, the numbers are not limited thereto. Although an example in which the number of the bit lines BL in each group GP and the number of the word lines WL in each group GP are 4 has been described, the numbers are not limited thereto. For example, the total number of the bit lines BL and the total number of the word lines WL may be 1024. In this case, the configuration may be such that the bit lines BL and the word lines WL are each divided into 32 groups GP each including 32 lines. Further, a plurality of the memory cell arrays MCA may be provided in one semiconductor storage device.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of first signal lines divided into a plurality of groups respectively including m (m is an integer equal to or larger than 2) lines;
a plurality of second signal lines;
a memory cell array including a plurality of memory cells provided to respectively correspond to intersections between the first signal lines and the second signal lines;
(m+2) or more global signal lines configured to apply a selection voltage to any of the first signal lines;
a plurality of first transistors provided to correspond to each of the first signal lines in one-to-one correspondence and connected between the first signal lines and the global signal lines, and
a plurality of first selection signal lines provided to respectively correspond to the groups, and each connected to gate electrodes of the first transistors included in a corresponding one of the groups in common, wherein
the first signal lines located at both ends of each of any two of the groups which are adjacent to each other are connected to mutually different ones of the global signal lines.

2. The device of claim 1, wherein the global signal line corresponding to the first signal lines at one ends or the other ends of the respective groups is divided into two or more.

3. The device of claim 1, wherein
the first transistors electrically connect the first signal lines included in a selected one of the groups and the global signal lines to each other, respectively, and
when a selected one of the first signal lines is located at an end of the selected group, the transistors also electrically connect the first signal lines included in an adjacent group adjacent to the selected first signal line and the global signal lines to each other, respectively.

4. The device of claim 2, wherein
the first transistors electrically connect the first signal lines included in a selected one of the groups and the global signal lines to each other, respectively, and
when a selected one of the first signal lines is located at an end of the selected group, the transistors also electrically connect the first signal lines included in an adjacent group adjacent to the selected first signal line and the global signal lines to each other, respectively.

5. The device of claim 1, wherein
- the first transistors electrically connect the first signal lines included in a selected one of the groups and the global signal lines to each other, respectively, and
- when a selected one of the first signal lines is located at an intermediate position in the selected group, the first transistors electrically connect the first signal lines included in the selected group and the global signal lines to each other, respectively, and do not connect the first signal lines in an unselected group other than the selected group to the global signal lines.

6. The device of claim 2, wherein
- the first transistors electrically connect the first signal lines included in a selected one of the groups and the global signal lines to each other, respectively, and
- when a selected one of the first signal lines is located at an intermediate position in the selected group, the first transistors electrically connect the first signal lines included in the selected group and the global signal lines to each other, respectively, and do not connect the first signal lines in an unselected group other than the selected group to the global signal lines.

7. The device of claim 3, wherein
- the first transistors electrically connect the first signal lines included in a selected one of the groups and the global signal lines to each other, respectively, and
- when a selected one of the first signal lines is located at an intermediate position in the selected group, the first transistors electrically connect the first signal lines included in the selected group and the global signal lines to each other, respectively, and do not connect the first signal lines in an unselected group other than the selected group to the global signal lines.

8. The device of claim 1, wherein
- the global signal lines apply the selection voltage to a selected one of the first signal lines, and
- the global signal lines apply a non-selection voltage to the first signal lines that are on both sides of the selected one of the first signal lines and are adjacent thereto.

9. The device of claim 2, wherein
- the global signal lines apply the selection voltage to a selected one of the first signal lines, and
- the global signal lines apply a non-selection voltage to the first signal lines that are on both sides of the selected one of the first signal lines and are adjacent thereto.

10. The device of claim 3, wherein
- the global signal lines apply the selection voltage to a selected one of the first signal lines, and
- the global signal lines apply a non-selection voltage to the first signal lines that are on both sides of the selected one of the first signal lines and are adjacent thereto.

11. The device of claim 8, wherein
- the global signal lines cause the first signal lines other than the selected first signal line and the first signal lines that are on both sides of the selected first signal line and are adjacent thereto, to be electrically floating.

12. The device of claim 1, wherein
- the global signal lines apply the selection voltage to a selected one of the first signal lines, and
- the global signal lines apply a non-selection voltage to the first signal lines that are two each on both sides of the selected one of the first signal lines and are adjacent thereto.

13. The device of claim 2, wherein
- the global signal lines apply the selection voltage to a selected one of the first signal lines, and
- the global signal lines apply a non-selection voltage to the first signal lines that are two each on both sides of the selected one of the first signal lines and are adjacent thereto.

14. The device of claim 3, wherein
- the global signal lines apply the selection voltage to a selected one of the first signal lines, and
- the global signal lines apply a non-selection voltage to the first signal lines that are two each on both sides of the selected one of the first signal lines and are adjacent thereto.

15. The device of claim 12, wherein
- the global signal lines cause the first signal lines other than the selected first signal line and the first signal lines that are two each on both sides of the selected first signal line and are adjacent thereto, to be electrically floating.

16. The device of claim 1, wherein the first signal lines in the groups that are arranged every other location share the global signal lines.

17. The device of claim 1, wherein intermediate first signal lines other than the first signal lines located at both ends of each of any two of the groups which are adjacent to each other share the global signal lines.

* * * * *